(12) United States Patent
Yoo

(10) Patent No.: US 7,194,199 B2
(45) Date of Patent: Mar. 20, 2007

(54) STACKED ANNEALING SYSTEM

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 1 day.

(21) Appl. No.: 11/144,359

(22) Filed: Jun. 3, 2005

(65) Prior Publication Data

US 2006/0291830 A1  Dec. 28, 2006

(51) Int. Cl.
*A21B 2/00* (2006.01)
*C23C 16/00* (2006.01)

(52) U.S. Cl. ..................... 392/416; 118/724

(58) Field of Classification Search ........... 392/416, 392/407, 417, 418; 438/709; 219/405, 411; 118/724, 725, 722; A21B 2/00; C23C 16/00
See application file for complete search history.

(56) References Cited

U.S. PATENT DOCUMENTS

| | | | |
|---|---|---|---|
| 4,169,007 A * | 9/1979 | Pray | 156/359 |
| 5,802,856 A * | 9/1998 | Schaper et al. | 62/3.7 |
| 6,018,616 A * | 1/2000 | Schaper | 392/418 |
| 6,095,083 A * | 8/2000 | Rice et al. | 118/723 I |
| 6,345,150 B1 * | 2/2002 | Yoo | 392/418 |
| 6,353,209 B1 * | 3/2002 | Schaper et al. | 219/444.1 |
| 6,359,264 B1 * | 3/2002 | Schaper et al. | 219/444.1 |
| 6,590,186 B2 * | 7/2003 | Tanaka et al. | 219/390 |
| 6,809,035 B2 * | 10/2004 | Yoo | 438/709 |

\* cited by examiner

*Primary Examiner*—Daniel Robinson
(74) *Attorney, Agent, or Firm*—MacPherson Kwok Chen & Heid LLP; Tom Chen

(57) ABSTRACT

A process chamber includes an opening, two or more stacked cold plates adjacent the opening, two or more stacked hot plates adjacent the cold plates, and a rotatable wafer transport capable of moving a wafer between the cold plates and between the hot plates for processing of the wafer. The wafer can be rapidly heated while between the hot plates. The wafer transport has perpendicular walls about a pivot such that when the wafer is between the cold plates or between the hot plates, one of the walls separates the cold and hot portions, thereby increasing the efficiency of cooling and heating.

7 Claims, 4 Drawing Sheets

STACKED ANNEALING SYSTEM

BACKGROUND

1. Field of the Invention

The present invention relates generally to semiconductor wafer processing systems, and more particularly to such systems for the transfer of semiconductor wafers to a processing chamber.

2. Related Art

High temperature processing of silicon wafers is important for manufacturing modern microelectronics devices. Such processes, including silicide formation, implant anneals, oxidation, diffusion drive-in and chemical vapor deposition (CVD), may be performed at high temperatures using conventional thermal processing techniques. Furthermore, many microelectronics circuits require feature sizes smaller than one micron and junction depths less than a few hundred angstroms. In order to limit both the lateral and downward diffusion of dopants, as well as to provide a greater degree of control during processing, it is desirable to minimize the duration of high temperature processing.

Semiconductor wafers, flat panel displays, and other similar substrates typically have numerous material layers deposited thereon during device fabrication. Some commonly deposited layers (e.g., spin-on glass (SOG) films) may contain contaminants, defects or undesirable microstructures that can be reduced or removed by heating or "annealing" the substrate at an appropriate temperature for an appropriate time. Other deposited layers (e.g., copper films) may have properties that undesirably change over time or "self-anneal", resulting in unpredictable deposited layer properties (e.g., unpredictable resistivity, stress, grain size, and hardness). As with contaminants, defects, and undesirable microstructures, deposited layer properties often can be stabilized by a controlled annealing step. Following the annealing step, the substrate preferably is rapidly cooled to stop the annealing process, and so that other processes can be performed on the substrate, in order to increase throughput.

Conventionally, annealing is performed within a quartz furnace that must be slowly pre-heated, such as by lamps, to a desired annealing temperature, or within a rapid thermal process (RTP) system that can be rapidly heated to a desired annealing temperature. Unfortunately, conventional lamp-based RTP systems have considerable drawbacks with regard to uniform temperature distribution. One alternative to lamp-based RTP systems is to use a hot plate annealing to heat the wafer. Such systems are disclosed in commonly-owned U.S. Pat. Nos. 6,809,035 and 6,345,150, both of which are incorporated by reference in their entirety. These systems use a hot plate, which can be heated by heating elements on or adjacent to the plate or plates, positioned below and/or above the wafer. The hot plate enables the wafer to be quickly brought to a desired temperature, such as for annealing.

Thereafter, an annealed substrate is transferred to a separate cooling module that conventionally employs a cooled substrate support and is slightly backfilled with a gas such as helium to enhance thermal conduction. The separate cooling module increases equipment cost and complexity, as well as equipment footprint, and decreases substrate throughput by requiring undesirable substrate transfer time between the heating and cooling systems. Other conventional processing systems have a cooling mechanism within the same chamber as the hot plate, as opposed to in a separate module. Cooling down a heated chamber or heating up a cooled chamber requires additional energy and time.

Accordingly, it is desirable to have a system capable of heating or cooling a wafer for RTP or other processes without disadvantages of conventional systems, discussed above.

SUMMARY

According to one aspect of the present invention, a process chamber includes at least two stacked cold plates and at least two adjacent stacked hot plates. A rotatable wafer transport pivots about a point between the hot plates and the cold plates located near a side of the process chamber. The wafer transport comprises two walls connected to the pivot point and perpendicular to each other and a wafer support extending from at least one of the walls to support a wafer thereon. The wafer support is positioned such that the wafer can be placed between the two cold plates or the two hot plates for cooling or heating, respectively.

In one aspect of the invention, a wafer is inserted into the process chamber and onto the wafer transport, such as by a robot. The wafer transport is positioned such that the wafer is between two cold plates, with one of the transport walls separating the cold plates from the hot plates. Once a desired temperature is achieved, such as measured by thermocouples attached to the wafer transport, the wafer transport is rotated 90°. As a result, the wafer is moved from in between the cold plates to in between the hot plates and one of the walls of the transport again separating the hot plates from the cold plates. The wafer can then be rapidly heated by the hot plates to the desired processing temperature. When processing is completed, the wafer transport is rotated back 90° to move the wafer between the two cold plates for cooling. The wafer can then be removed from the chamber or rotated back to the hot plates for additional processing.

The process chamber having two adjacently stacked cold and hot plates can be themselves stacked to create a low cost, simple vertical multi-wafer processing system having a small footprint. In another embodiment, N stacked cold plates and N stacked hot plates can be adjacently placed into a single process chamber so that N-1 wafers can be heated and cooled simultaneously, where N is greater than two.

Advantages of the present invention include more efficient cooling and heating of the wafer since the heating area and the cooling area within the process chamber are separated by walls on the wafer transport. Because the cool environment from the cold plates is not completely open with the heated environment from the hot plates, it takes less time and energy to heat and cool the wafer. Further, since the cooling mechanism is in the same process chamber as the heating mechanism, a simpler process chamber is possible.

These and other features and advantages of the present invention will be more readily apparent from the detailed description of the preferred embodiments set forth below taken in conjunction with the accompanying drawings.

BRIEF DESCRIPTION OF THE FIGURES

Like element numbers in different figures represent the same or similar elements.

DETAILED DESCRIPTION

Figure 1A:
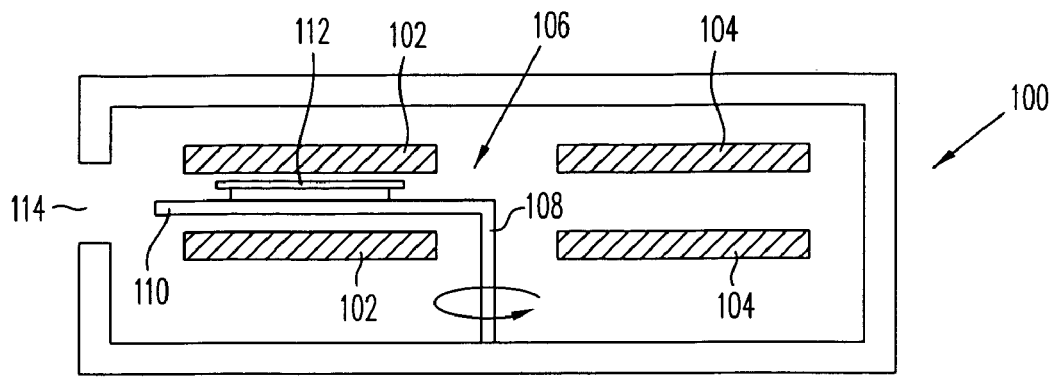
FIGS. 1A and 1B show side and top views, respectively, of a process chamber according to one embodiment of the invention.
Figure 1B:
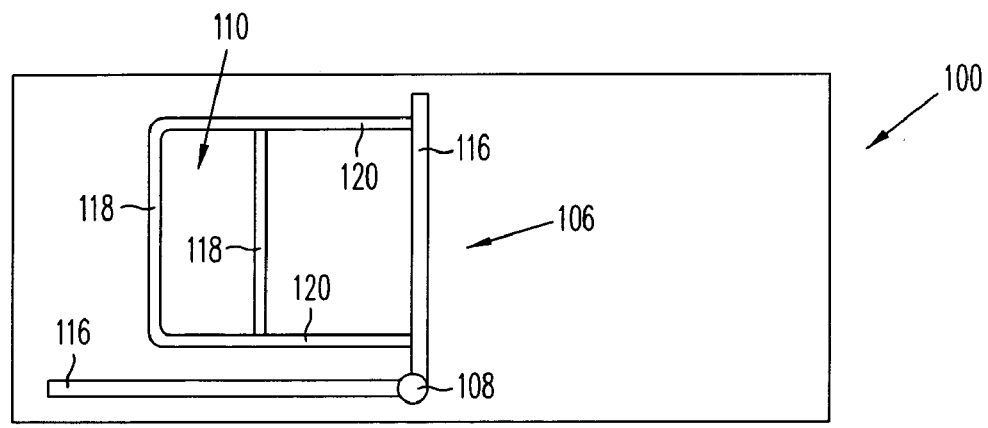

FIGS. 1A and 1B show side and top views, respectively, of a process chamber 100 according to one embodiment of the invention. Referring to FIG. 1A, chamber 100 includes two stacked cold plates 102 on one side and two stacked hot plates 104 on the other side. A rotatable wafer transport 106 is rotatable about a pivot or axis 108 between cold plates 102 and hot plates 104. Wafer transport 106 includes a wafer support 110 for holding a wafer 112, where the wafer that can be rotated between cold plates 102 and between hot plates 104. When wafer 112 is between cold plates 102, the wafer is cooled. When wafer 112 is rotated between hot plates 104, the wafer is heated to a desired temperature, such as for RTP or annealing. Chamber 100 includes an opening 114 to enable the wafer to be placed into and removed from chamber 100. Once the wafer is either inserted or removed from the chamber, the opening can be sealed, as is known in the art with conventional mechanisms.

Opening 114 of chamber 100 may be a relatively small opening, but with a width large enough to accommodate a wafer of between about 0.5 to 2 mm thick and up to 300 mm in diameter and enable a robot arm or other wafer transfer mechanism to enter and maneuver. In one embodiment, the height of opening 114 is no greater than between about 15 mm and 40 mm, preferably, no greater than 20 mm. The relatively small opening size helps to reduce cold and/or heat loss from process chamber 100. In addition, the small opening size keeps down the number of particles entering process chamber 100 and allows for easier maintenance of the isothermal temperature environment.

Referring now to FIG. 1B, wafer transport 106 includes perpendicular walls 116 extending from axis 108. Opening 114 allows the wafer to be placed onto wafer support 110, which in this embodiment is two parallel rods or beams 118 connected to arms 120 extending from one of walls 116. Other suitable wafer supports can also be used, such as a grid of thin intersecting beams with protruding pin supports to minimize the amount of contact on the wafer surface. One or more supports may include a thermocouple or other temperature sensing device embedded therein to monitor the temperature of the wafer. In one embodiment, the rods or beams are made of a conductive or non-insulating material, which results in quicker heating and cooling of the wafer. Walls 116 extend to the edges of the chamber and are made of an insulating material in one embodiment. Walls 116 are also short enough to fit between two hot or cold plates and may include multiple segments, such as segments between the plates, above the plates, and below the plates.

Figure 2:
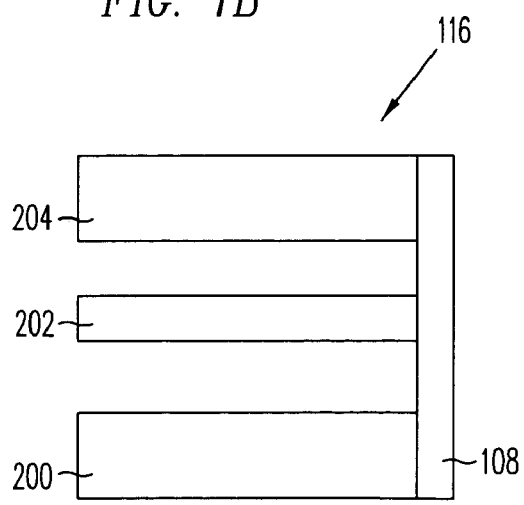
FIG. 2 is a side view of one of the walls of the wafer transport used in the process chamber of FIGS. 1A and 1B according to one embodiment.

FIG. 2 is a side view of showing one of walls 116 according to one embodiment having three segments 200, 202, and 204 extending from axis 108. The wafer is located on the wafer support attached to middle segment 202. Lower segment 200 is located below the lower cold and hot plates, and the upper segment 204 is located above the upper cold and hot plates. Thus, the gaps between segments 200 and 202 and between segments 202 and 204 are such that the cold and hot plates are able to rotate in and out between them.

Figure 3A:
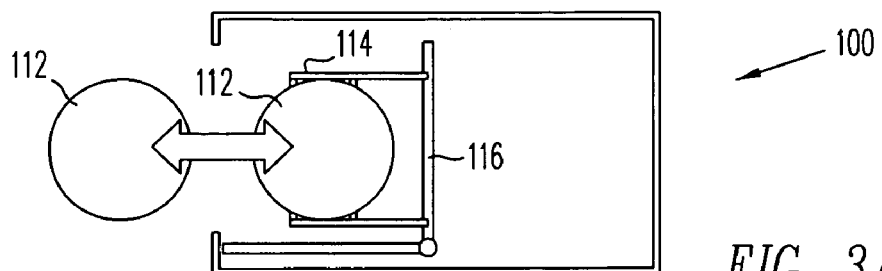
FIGS. 3A–3D are top views showing the operation of the process chamber of FIGS. 1A and 1B according to one embodiment.
Figure 3B:
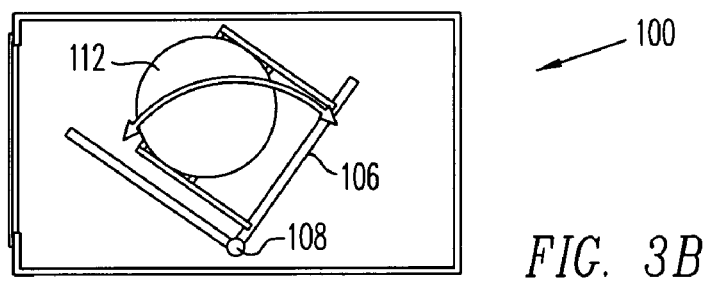
Figure 3C:
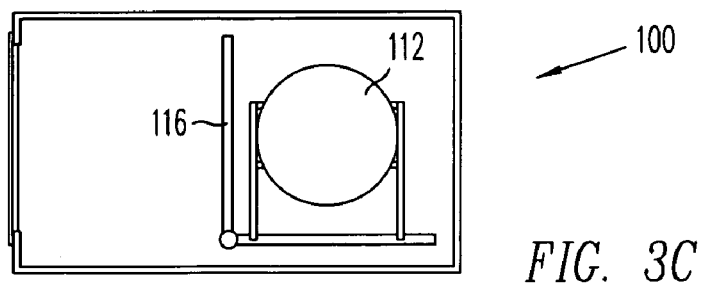
Figure 3D:
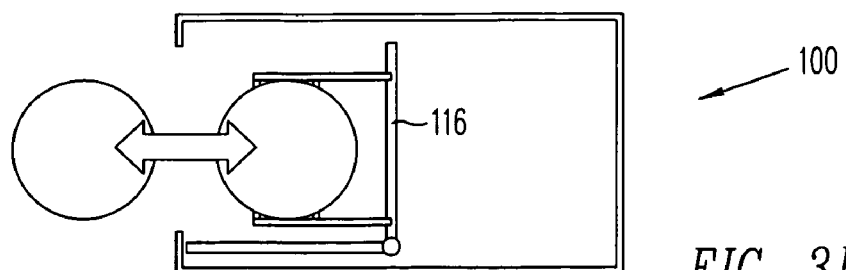

FIGS. 3A–3D are top views showing the operation of process chamber 100 according to one embodiment. Note that FIGS. 3A to 3D do not show the hot and cold plates for ease of illustration. In FIG. 3A, wafer 112 is inserted into chamber 100 and onto wafer support 110 through opening 114. Wafer 112 can be loaded from a wafer container, such as a Front Opening Unified Pod (FOUP), a loading station, or other suitable location or component. A robot or other transfer mechanism can be used to retrieve the wafer and insert it onto wafer support 110. In this position, wafer 112 is located directly between the two cold plates. Depending on the temperature of the cold plates and the amount of time the wafer is between the cold plates, wafer 112 can be cooled down to a desired temperature. Next, in FIG. 3B, wafer transport 106 is rotated about axis 108, such as with an external motor, to move wafer 112 away from the cold plates and toward the hot plates. In FIG. 3C, wafer transport 106 has been rotated 90° so that wafer 112 is now completely between the two hot plates. Hot plates then heat wafer 112 to a desired temperature for processing. After processing, wafer transport 106 is rotated 90° back toward the cold plates. Once the wafer is cooled to a desired temperature, the wafer is removed from process chamber 100, as shown in FIG. 3D, or transferred back onto the hot plate for additional processing.

Hot plate 104 may have a large mass relative to wafer 112 and may be fabricated from a material, such as silicon carbide, quartz, inconel, aluminum, steel, or any other material that will not react at high processing temperatures with any ambient gases or with wafer 112. Hot plate 104 may be formed into any geometric shape, preferably a shape which resembles that of the wafer, e.g., a circular plate. In one embodiment, the hot plate is circular with a radius slightly larger than the largest wafer to be processed, e.g., a 300 mm wafer.

Hot plate 104 can include heating elements to control the temperature of the hot plate. In one embodiment, at least one heat source is located on a periphery of hot plate 104. The heat source may be a resistive heating element or other conductive/radiant heat source, which can be made to contact a peripheral portion of hot plate 104 or is embedded within hot plate 104. The resistive heating element may be made of any high temperature rated material, such as a suitable resistively heatable wire, which is made from a high mass material for increased thermal response and high temperature stability, such as SiC, SiC coated graphite, graphite, AlCr, AlNi and other alloys. The temperature of hot plate 104 may be controllable to provide a variable temperature depending on the application, e.g., between about 50° C. and about 1500° C., preferably between about 100° C. and about 1200° C.

Cold plate 102 can be of similar shape as hot plate 104, i.e., circular with a slightly larger diameter than the largest wafer. Cold plate 102 may include individual cooling elements, such as electrical, liquid, or gas cooling components. For example, cold plate 102 can include a plurality of gas ports in the cold plate to provide a cooling gas to the wafer, where the cooling gas is supplied from an external gas source. The gas source can be tunable to selectively supply one or more gases to the plurality of holes in the cold plate, where the amount of gas supplied to the cold plate is controlled by the controller based in part on the desired temperature of the wafer or cold plate.

As seen from FIGS. 3A, 3C, and 3D, when wafer 112 is between the cold plates (FIGS. 3A and 3D), wall 116 separates the cold plates and the hot plates, resulting in a more efficient cooling of the wafer since the amount of heat from the hot plates is kept away from the cold plates. Similarly, heating is also more efficient, since during heating (FIG. 3C), wall 116 again separates the hot plates from the cold plates, thereby reducing the amount of cold entering the heating area. Walls made of a non-conductive material or insulating material helps keep the cold from the hot plate area and heat from the cold plate area.

In accordance with one embodiment of the invention, process chamber 100 is an RTP chamber, such as those used in thermal anneals, dopant diffusion, thermal oxidation, nitridation, chemical vapor deposition, and similar processes. Process chamber 100 has a small interior cavity. The small process chamber volume allows chamber 100 to be made smaller, and as a result, the overall system may be made more compact, requiring less clean room floor space. If a robot wafer loader, such as disclosed in U.S. Pat. No. 6,345,150, is used to transfer wafers into and out of the process chamber, multiple chambers can be vertically stacked, e.g., directly over each other, to minimize floor space occupied by the system. Such a robot wafer loader can be moved up and down, rotated, and extended to retrieve wafers from a storage container, such as a FOUP, and transfer the wafer into the process chamber.

Figure 4:
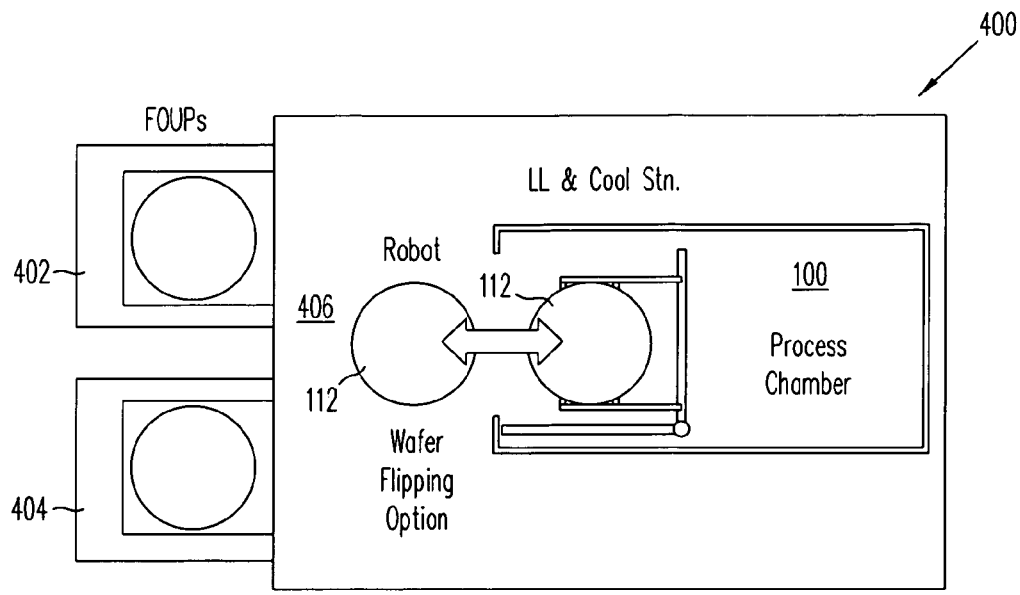
FIG. 4 is a top view of a portion of a semiconductor wafer processing system according to one embodiment.

FIG. 4 is a top view of a portion of a semiconductor wafer processing system 400, which includes process chamber 100, FOUPs 402 and 404, and a transfer station 406. FOUP 402 or 404 can be accessed by a transport mechanism (not shown), which moves wafers from a FOUP to transfer station 406 or process chamber 100. The transport mechanism can be a robot that can be rotated and raised up and down with an extendable arm to move the wafer to a desired destination. The operation and functions performed by a transport mechanism and FOUPs are generally well known and understood by those of ordinary skill in the art. For example, the transport mechanism may include a robot arm and an end-effector, each of which may be made of a heat resistant material such as quartz, for picking-up and placing wafers 112. The end-effector can be fixedly attached to an attachment block on the end of the robot arm, which accepts a variety of end-effectors. For example, for a 3-axis robot, the robot arm can be made of multi-linkages capable of performing an S-motion or snake motion. The S-motion allows the robot to be positioned in a fixed location of process system 400, while the robot arm is capable of accessing each module of the process system. For other types of robots, such as a 4-axis robot, the S-motion is not needed. Those skilled in the art will realize appropriate constructions of robots, based on the type of robot. The transport mechanism may also function to flip wafer 112 before insertion into process chamber 100. This enables both sides of a wafer to be processed within the process chamber.

Figure 5:
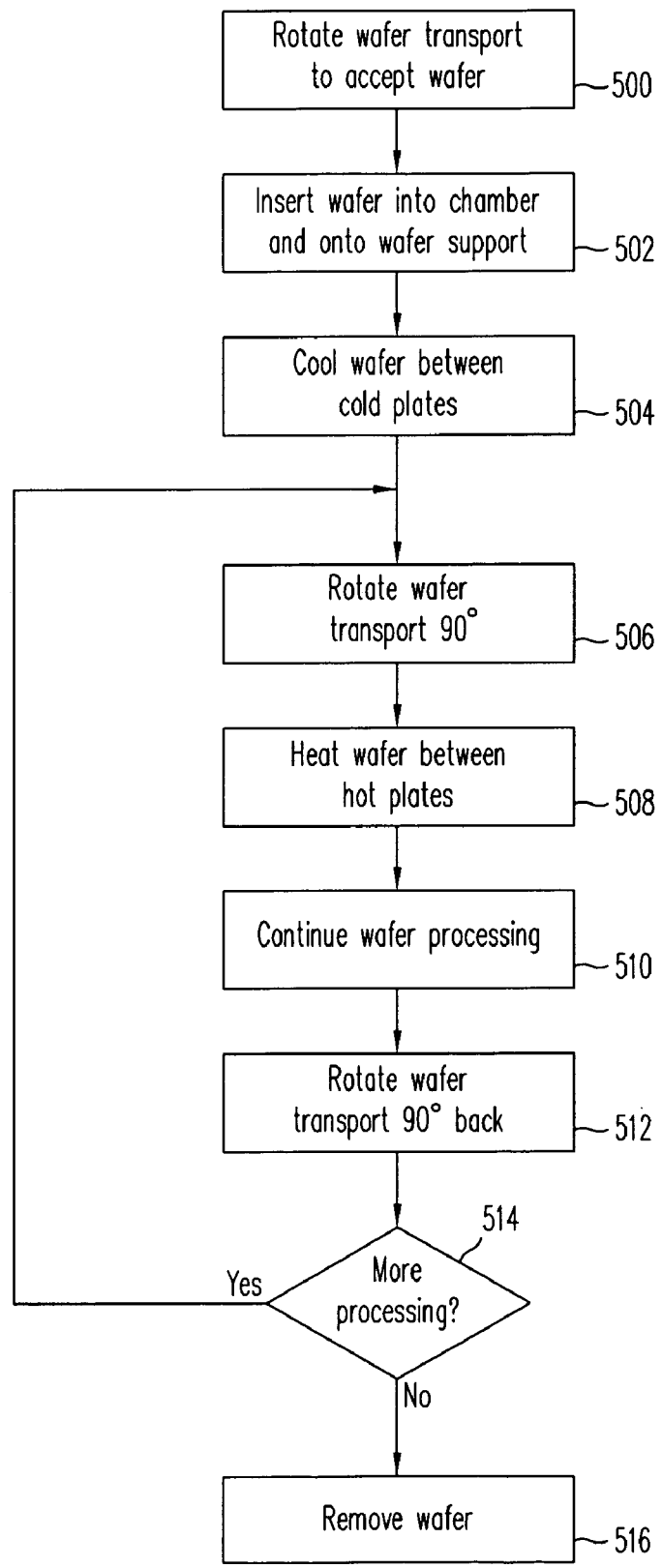
FIG. 5 is a flow chart showing one embodiment of the present invention for use with the process chamber of FIGS. 1–4.

FIG. 5 is a flow chart showing one embodiment of the present invention for use with the process chamber of FIGS. 1–4. In operation 500, the wafer transport is rotated within the process chamber so that a first one of the two arms of the wafer transport is parallel to a side wall (or perpendicular to the wall with the opening) and the second arm is between the hot plates and the cold plates. In this position, the wafer can be inserted onto the wafer transport, and the cold and hot zones are separated from each other. Next, the wafer is inserted, such as from a FOUP, into the process chamber and onto the wafer support attached to the wafer transport in operation 502. In this position, the wafer is between two cold plates, where it is cooled, as needed, in operation 504. The wafer transport is then rotated, in operation 506, 90° so that the wafer is removed from the cold plates and moved between the two hot plates. After the 90° rotation, the first arm separates the cold plates and the hot plates, while the second arm is close to and parallel to the side wall. The wafer is then rapidly heated between the two hot plates in operation 508.

After the wafer has attained the desired temperature, the wafer is processed in operation 510. Next, in operation 512, the wafer transport is rotated back 90°, where the wafer is moved between the cold plates. If, as determined in operation 514, additional processing is required, the wafer transport is rotated 90° in operation 506 to place the wafer between the hot plates for heating of the wafer in operation 508. However, if processing is complete, the wafer is removed from the process chamber in operation 516. Thus, the present invention enables the rapid thermal processing of a wafer using a simpler and smaller system.

Figure 6:
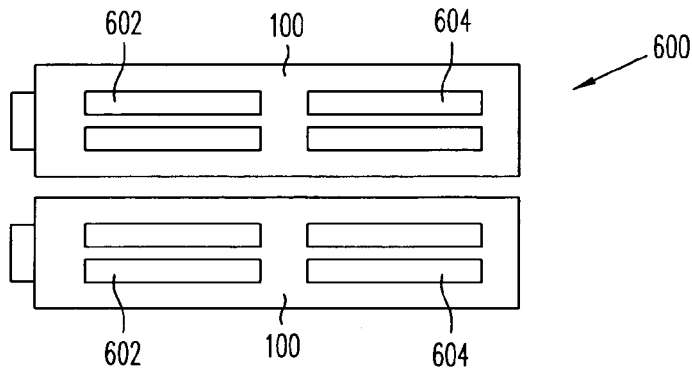
FIG. 6 is a side view of a multi-wafer process system with stacked chambers according to one embodiment.

In another embodiment, process chamber 100 can be stacked, as shown in FIG. 6, to form a multi-wafer process system 600. While FIG. 6 shows just two stacked chambers, any number of chambers can be stacked as desired within system constraints. System 100 includes four cold plates 602 and four hot plates 604, capable of processing two wafers simultaneously. Each process chamber 100 has its own opening for inserting and removing the wafer form the individual chambers.

Figure 7:
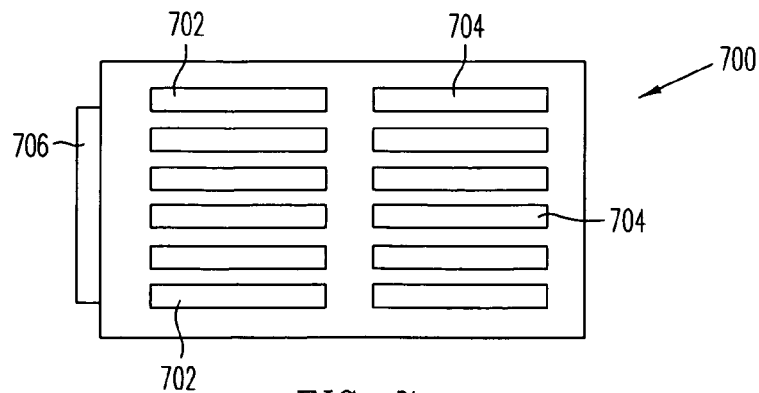
FIG. 7 is a side view of a multi-wafer process system with stacked plates according to one embodiment.

FIG. 7 shows yet another embodiment in which more than two cold plates and more than two hot plates are stacked within a single process chamber 700. Process chamber 700 is shown with six stacked cold plates 702 and six stacked hot plates 704, capable of processing five wafers at a time. This embodiment enables wafers to be heated and cooled with less hot and cold plates than the system of FIG. 6. A single opening 706 allows wafers to be inserted and moved from chamber 700. Because of the increased height of the chamber, the transport mechanism will have to have a higher range of vertical motion in order to load wafers between any two adjacent cold plates 702.

Having thus described embodiments of the present invention, persons of ordinary skill in the art will recognize that changes may be made in form and detail without departing from the scope of the invention. Thus the invention is limited only by the following claims.

What is claimed is:

1. A process chamber for processing a semiconductor wafer, comprising:
    an opening on one side of the process chamber for inserting and removing the wafer into and from the process chamber;
    a plurality of stacked cold plates adjacent to the opening, wherein the wafer is placed between two adjacent cold plates for processing;
    a plurality of stacked hot plates adjacent the cold plates, wherein the wafer is placed between two adjacent hot plates for heating; and
    a wafer transport comprising:
        a pivot between the stacked hot plates and the stacked cold plates;
        a first wall attached to the pivot;
        a second wall attached to the pivot and perpendicular to the first wall; and a wafer support extending from the first wall for supporting the wafer, wherein the transport is rotatable to move the wafer between two adjacent hot plates and between two adjacent cold plates.

2. The process chamber of claim 1, wherein the plurality is two.

3. The process chamber of claim 1, wherein the plurality is greater than two.

4. The process chamber of claim 1, wherein the first and second wall each comprise first wall portions extending to a side wall of the process chamber.

5. The process chamber of claim 4, wherein the first and second wall each further comprise second wall portions extending to the side wall of the process chamber.

6. The process chamber of claim 4, wherein the first wall portions are positioned between adjacent cold plates and adjacent hot plates.

7. The process chamber of claim 5, wherein the second wall portions are positioned between a side wall of the process chamber and a hot or cold plate.

* * * * *